US008051397B2

(12) United States Patent
McCracken et al.

(10) Patent No.: US 8,051,397 B2
(45) Date of Patent: Nov. 1, 2011

(54) METHOD AND SYSTEM FOR CONDUCTING DESIGN EXPLORATIONS OF AN INTEGRATED CIRCUIT

(75) Inventors: Thaddeus Clay McCracken, Tigard, OR (US); Jong-Chang Lee, Macungie, PA (US); Ping-Chih Wu, Cupertino, CA (US); Cecile Nghiem, Union City, CA (US); Kit Lam Cheong, Palo Alto, CA (US); Patrick John Eichenseer, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/577,402

(22) Filed: Oct. 12, 2009

(65) Prior Publication Data

US 2010/0122228 A1 May 13, 2010

Related U.S. Application Data

(63) Continuation of application No. 11/700,284, filed on Jan. 30, 2007, now Pat. No. 7,603,643.

(51) Int. Cl.
*G06F 17/50* (2006.01)
(52) U.S. Cl. ........ 716/108; 716/118; 716/119; 716/130; 716/136
(58) Field of Classification Search .................. 716/4, 6, 716/8–10, 108, 118, 119, 130, 136
See application file for complete search history.

(56) References Cited

U.S. PATENT DOCUMENTS

| 6,154,873 | A  | * | 11/2000 | Takahashi ..................... 716/118 |
| 6,330,707 | B1 | * | 12/2001 | Shinomiya et al. ........... 716/130 |
| 6,889,326 | B1 | * | 5/2005 | Charbon et al. .............. 713/176 |
| 6,901,562 | B2 | * | 5/2005 | Cooke et al. ..................... 716/1 |
| 7,197,731 | B2 |   | 3/2007 | Katayama |
| 7,249,340 | B2 | * | 7/2007 | Cooke et al. .................... 716/17 |
| 7,506,278 | B1 | * | 3/2009 | Rjimati et al. ................ 716/104 |
| 2003/0115564 | A1 | * | 6/2003 | Chang et al. ..................... 716/8 |
| 2003/0131327 | A1 | * | 7/2003 | Dervisoglu et al. ............. 716/4 |
| 2003/0131330 | A1 |   | 7/2003 | Downer et al. |
| 2003/0200522 | A1 |   | 10/2003 | Roberts |
| 2007/0245280 | A1 | * | 10/2007 | Van Eijk et al. .................. 716/9 |

* cited by examiner

*Primary Examiner* — Vuthe Siek
*Assistant Examiner* — Magid Y Dimyan
(74) *Attorney, Agent, or Firm* — Vista IP Law Group, LLP (57) ABSTRACT

Method and system for conducting design explorations of an integrated circuit are disclosed. In one embodiment, the method includes obtaining a design description of the integrated circuit that includes a virtual design block, creating a representative netlist for representing the virtual design block, where the representative netlist includes one or more soft design models, and each soft design model comprises one or more template cells for modeling a portion of the integrated circuit. The method further includes defining physical attributes for the one or more soft design models in accordance with area requirements of the virtual design block, where the one or more soft design models are described with flexible shape and pin locations, performing design explorations of the integrated circuit using the one or more soft design models and their corresponding template cells, and generating a representative implementation of the integrated circuit using results of the design explorations.

21 Claims, 6 Drawing Sheets

METHOD AND SYSTEM FOR CONDUCTING DESIGN EXPLORATIONS OF AN INTEGRATED CIRCUIT

CROSS-REFERENCE TO RELATED APPLICATION

The present application is a Continuation of U.S. Non-Provisional application Ser. No. 11/700,284, filed Jan. 30, 2007, now issued as U.S. Pat. No. 7,603,643, on Oct. 13, 2009, the content of which is hereby incorporated by reference in its entirety.

FIELD OF THE INVENTION

The present invention relates to the field of electronic design automation tools. In particular, the present invention relates to a method and system for conducting design explorations of an integrated circuit.

BACKGROUND OF THE INVENTION

In recent years, consumer electronic devices, such as cellular phones, digital cameras, MP3 players, and personal digital assistant (PDA) devices, have had significant success in the marketplace. The compact design of such consumer electronic devices requires more and more functionalities to be packed into one integrated circuit chip, also referred to as system-on-chip (SoC). In response to this market demand, new semiconductor processing technologies, such as the 90 nm and 65 nm processing technologies, have made it feasible to place millions of logic gates on a single integrated circuit. With such processing technologies, functional blocks such as the central processing unit (CPU), memory, graphic applications, communication modules, and other specialized functions may be integrated onto the SoC.

In addition to more complexity, consumers continue to demand faster time-to-market for such electronic devices, which lead to shorter development cycles for SoCs. To meet this challenge, designers need to evaluate the design goals and cost objectives of a proposed integrated circuit design project long before a full gate-level netlist is available. Early design exploration and floorplanning exercises are aimed at assessing the design goals and cost objectives of an integrated circuit design, often before committing significant engineering resources to the development. These design explorations enable designers to learn about the physical constraints imposed on the design and to guide the front-end design process in the right direction.

Figure 1:
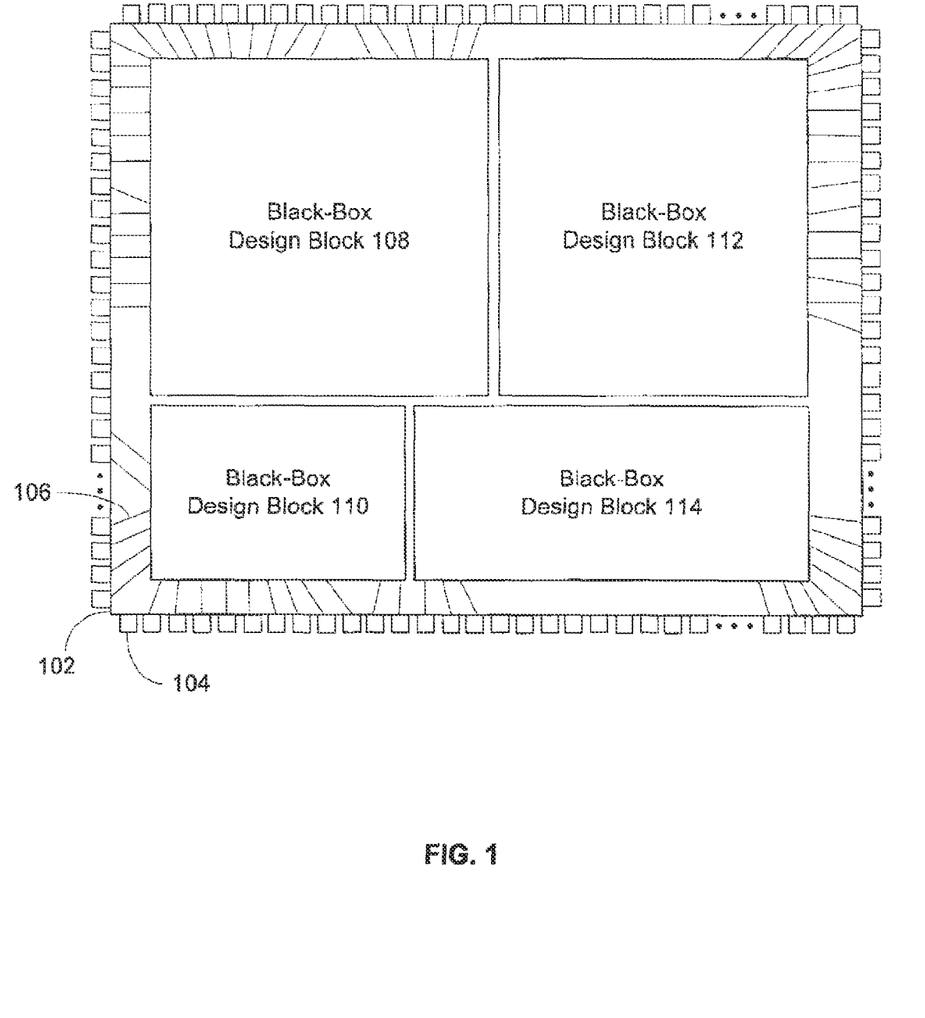
FIG. 1 illustrates a conventional integrated circuit design using black-box design blocks.

FIG. 1 illustrates a conventional approach for exploring an integrated circuit design using black-box design blocks. As shown in FIG. 1, four exemplary functional blocks of a SoC integrated circuit 102 are modeled as black-box design blocks (also known as black-boxes or design blocks for short), shown as 108, 110, 112, and 114. The black-box design blocks are connected to the external pins 104 of the chip through their respective bonding wires 106. Note that a typical SOC integrated circuit may contain many black-box design blocks. Some of these black-box design blocks may be purchased, licensed, or reused (from a prior project). The black-box design blocks are also referred to as intellectual property (IP) blocks, semiconductor IP blocks, virtual design blocks, or virtual circuit components. They include circuit blocks previously designed (typically being reused), circuit blocks currently being developed, or circuit blocks that have not been designed yet.

In this conventional design approach, black-box design blocks are used to represent large functional blocks of the integrated circuit to a level appropriate for top-level design exploration. It allows designers to conduct design exploration and floorplanning exercises before a complete netlist-level description of the design is available. Each of the black-box design blocks generally includes a hard layout extraction format (LEF) physical model, coupled with a timing (.lib) model, which in combination describe the shape and timing of the black-box design block.

Early-on in the design process, many circuit components, such as the CPU, memory interfaces, etc. that will eventually be replaced by gate-level netlists are modeled as black-box design blocks, either because no netlist is currently available, or in order to speed turnaround-time on early floorplan and design-exploration exercises. These circuit components are often referred to as hard-macros or hard physical models because they require fixed shape, pin locations, or routing obstruction information, which hinders the efficiency of early-stage design explorations as will be explained below.

One of the problems of the conventional design exploration using black-box design blocks is that the shapes or pin locations of the black-box design blocks are modified multiple times, often manually, during the design iteration process. This is due to the hard-macro nature of the conventional black-box design block, which has a fixed shape, fixed pin locations along the boundary of the block, and fixed routing obstructions over the block. Designers are required to define the shapes, pin locations, and routing obstructions before they can start the design exploration exercises. During the iterative design exploration exercise, each time the shapes, pin locations, or routing obstructions are modified, the previously defined shapes, pin assignments, or routing obstructions of the black-box design blocks can no longer be used. In other words, since many design exploration iterations require some number of black-boxes to be reshaped and pins to be reassigned, some of the efforts put into the previous iteration of the design are wasted. Designers need to repeat the design of the shapes, pin assignments, or routing obstructions of the black-box design blocks from scratch. This process is inefficient and time consuming.

Therefore, there is a need for conducting design explorations of an integrated circuit.

SUMMARY

The present invention generally relates to a method and system for conducting design explorations of an integrated circuit. In various embodiments described herein, the method removes the limitations imposed by the conventional method of hard black-box design block modeling, by using soft design models and their corresponding template cells that are combined with an interface timing model. The soft design models remove the need for the user to specify any shape or pin location information, and replace such information with a user-specified area for a soft design model. This area is used to drive automatic shaping and pin assignment that is designed to closely track the actual placement of a gate-level netlist of the black-box design block. This approach improves the accuracy of the design, and increases overall user productivity by eliminating the need for the user to specify detailed shapes and pin locations during design iterations of the design exploration process.

In one embodiment, a method for conducting design explorations of an integrated circuit includes obtaining a design description of the integrated circuit that includes a virtual design block, creating a representative netlist for representing the virtual design block, where the representative netlist includes one or more soft design models, and each soft design model comprises one or more template cells for modeling a portion of the integrated circuit. The method further includes defining physical attributes for the one or more soft design models in accordance with area requirements of the virtual design block, where the one or more soft design models are described with flexible shape and pin locations, performing design explorations of the integrated circuit using the one or more soft design models and their corresponding template cells, and generating a representative implementation of the integrated circuit using results of the design explorations.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

Like numbers are used throughout the Figures.

DESCRIPTION OF EMBODIMENTS

Methods and systems are provided for conducting design explorations of an integrated circuit. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Figure 2:
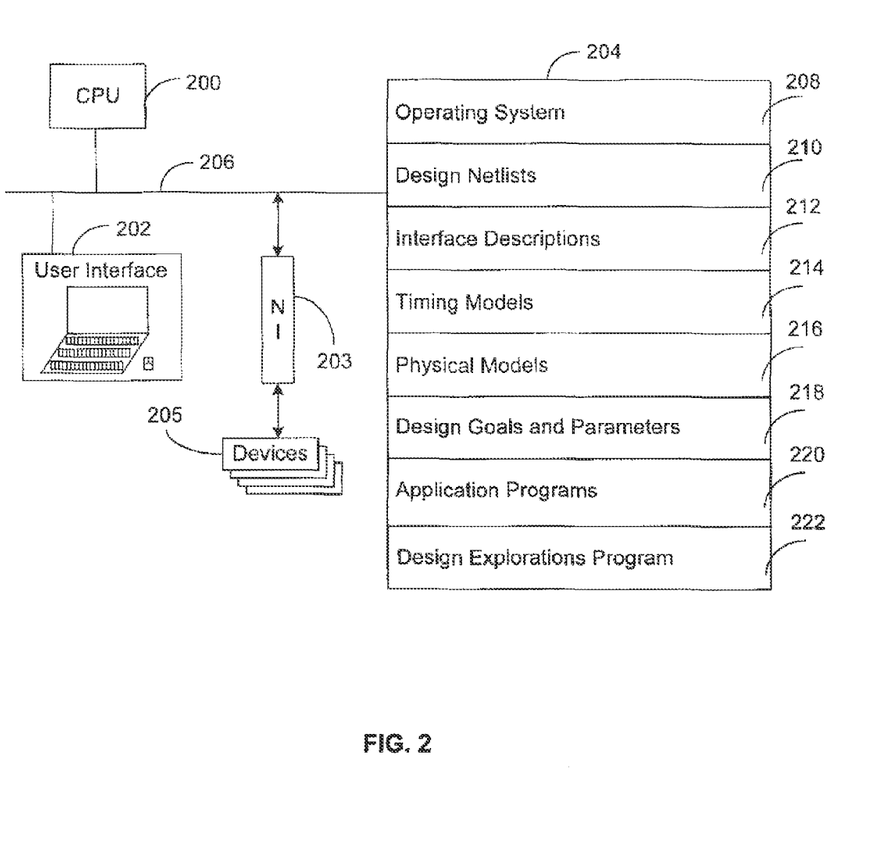
FIG. 2 illustrates a system for conducting design explorations of an integrated circuit according to an embodiment of the present invention.

FIG. 2 illustrates a system for conducting design explorations of an integrated circuit according to an embodiment of the present invention. In one embodiment, the method and system for conducting design explorations of an integrated circuit may be implemented using a computer system. The computer system may include one or more central processing units (CPUs) 200, at least a user interface 202 for displaying computation results and waveforms, a memory device 204, a system bus 206, and one or more bus interfaces for connecting the CPU, user interface, memory device, and system bus together. The computer system also includes at least one network interface 203 for communicating with other devices 205 on a computer network. In alternative embodiments, much of the functionality of the method and system, for conducting low-power design explorations may be implemented in one or more application-specific integrated circuits (ASICs) or field-programmable gate arrays (FPGAs), thereby either eliminating the need for a CPU, or reducing the role of the CPU.

The memory device 204 may include high-speed random-access memory and may also include non-volatile memory, such as one or more magnetic disk storage devices. The memory device may also include mass storage that is located remotely from the CPU(s). The memory device preferably stores:

- an operating system 208 that includes procedures for handling various basic system services and for performing hardware-dependent tasks;
- databases for storing information of the circuit, the databases include design netlists 210, interface descriptions 212, timing models 214, physical models 216, design goals and parameters 218;
- application programs 220 for performing other user-defined applications and tasks; and
- a design explorations program 222 for conducting design explorations of an integrated circuit.

The databases, the application programs, and the program for conducting design explorations may include executable procedures, sub-modules, tables, and other data structures. In other embodiments, additional or different modules and data structures may be used, and some of the modules and/or data structures listed above may not be used.

Figure 3:
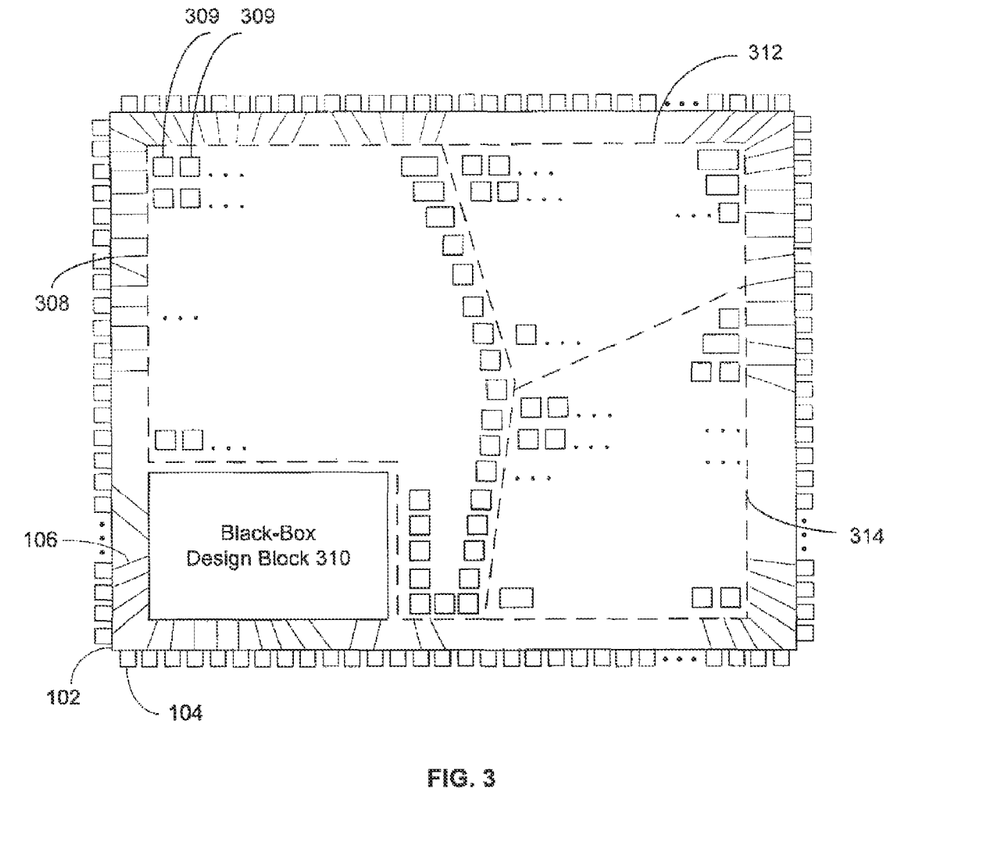
FIG. 3 illustrates an integrated circuit design using soft design models according to an embodiment of the present invention.

FIG. 3 illustrates an integrated circuit design using soft design models according to an embodiment of the present invention. In this example, the black-box design blocks of FIG. 1 are modeled using a combination of soft design models and hard macros. Specifically, the black-box design blocks 108, 112, and 114 are represented by the soft design models 308, 312, and 314 respectively. The black-box design block 110 is represented by block 310 as a hard macro cell and thus its shape is unchanged.

Each soft design model may include one or more template cells 309, and the template cells 309 may be different from each other and have different attributes and characteristics, such as area, shape, pin assignment, timing model, etc. The soft design model specifies the area but not the shape to be formed by the template cells. The area of a soft design model may be specified as number of square microns, or in a variety of other ways, including number of gates, or as a combination of gate-count and specifically defined macro instances.

In one embodiment, the method for conducting design explorations obtains collateral information from the black-box design blocks to build the soft design models. The collateral information includes a timing model (typically LIB) and a hard physical model (typically a LEF model). The hard physical model describes the physical characteristics of the design block (IP), such as the shape, the layers on which it is obstructed, and information about the pins comprising its external interfaces (size, layer, and location). The timing model describes timing aspects of the design block, such as the propagation delay through the component and/or timing arcs related to the interface of the component. In one embodiment, information about the following timing arcs may be obtained:

Clock-to-Q arc: this parameter specifies the time required for data to be valid at an output or inout pin, from the time a clock edge arrives on the associated clock pin.

Combinatorial arc: this parameter specifies the time required for data to be valid at an output or inout pin, from the time data arrives on an associated input pin(s).

Setup check: this parameter specifies the amount of time (relative to an associated clock edge) before which data must arrive on an input or inout pin in order to be correctly sampled and stored in a sequential storage device.

Hold check: this parameter specifies the amount of time (relative to an associated clock edge) after which data must remain valid on an input or inout pin in order for it to be correctly "sampled" and stored in a sequential storage device.

Max transition rule: this parameter specifies the maximum transition that may occur at a particular pin.

Max capacitance rule: this parameter specifies the maximum capacitance that can be driven by an output or inout pin.

Pin capacitance: this parameter specifies the capacitance presented to the driver of an input or inout pin, due to load present *inside* the entity being modeled.

Rise/Fall transition: this parameter specifies the transition time of an output or inout pin, as a function of: 1) the load on that pin, and 2) the transition at an associated input pin.

In other embodiments, information about the following timing arcs may be obtained:

Recovery check
Removal check
Clock gating setup check
Clock gating hold check
External delay assertion
Latch borrowed time check
Pulse width check
Clock period check Using the timing and physical information obtained from the black-box design blocks, the method uses the soft design models at the architectural level appropriate for full-chip design explorations. This method allows fast design iterations, and allows useful design activities to be performed in the absence of a fully detailed description of a particular design block. Note that in this example, timing for the soft design models are specified in the same manner as for a black-box design block. Thus, there is no change in timing of the representative template cell netlist from the user perspective. In other embodiments, the timing of the soft design models and their corresponding black-box design blocks may be different, depending on the design objectives and physical implementation of the integrated circuit.

Figure 4:
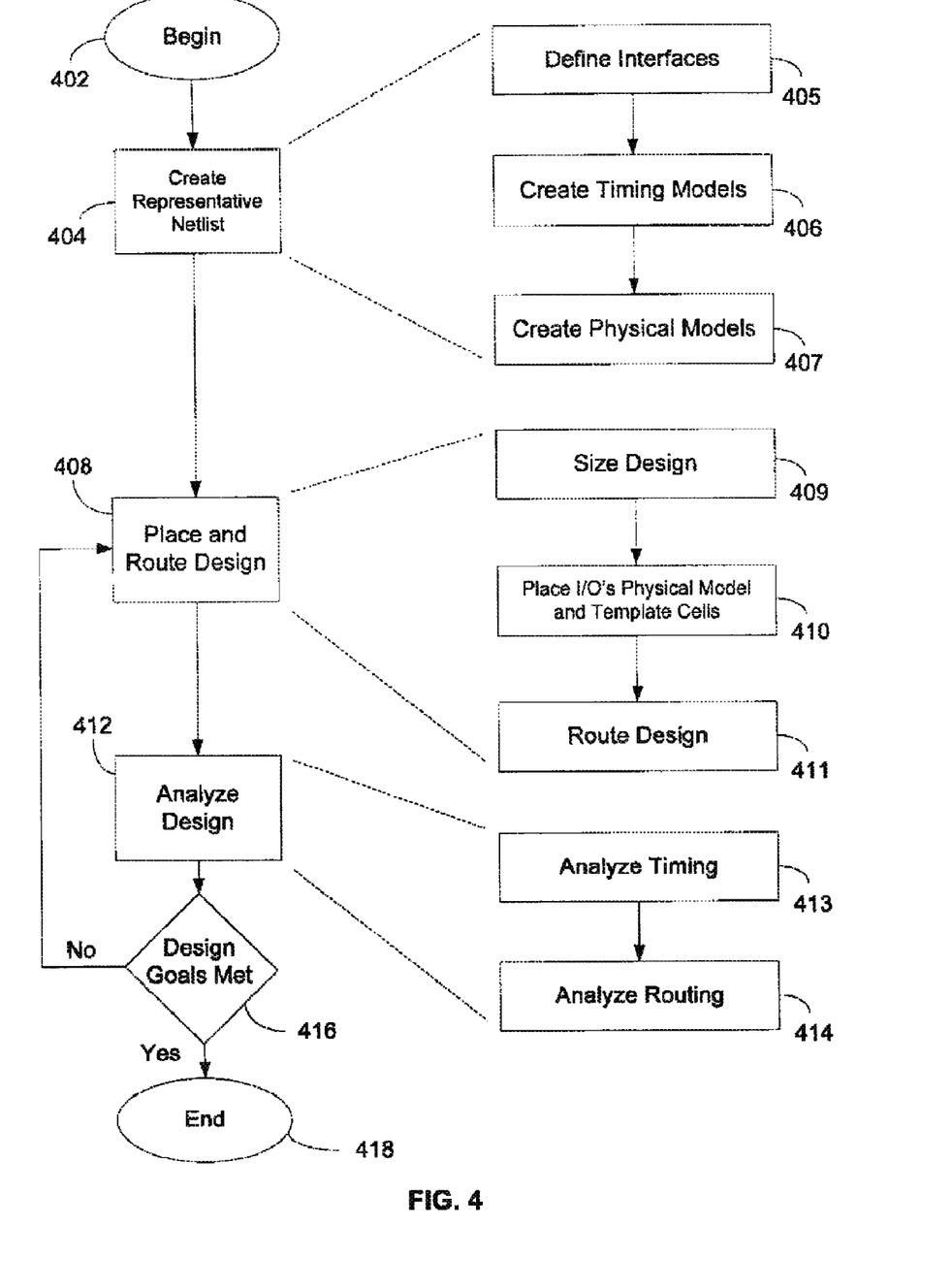
FIG. 4 illustrates a method for conducting design explorations of an integrated circuit according to an embodiment of the present invention.

FIG. 4 illustrates a method for conducting design explorations according to an embodiment of the present invention. In one implementation, the method begins in block 402 and thereafter moves to block 404 where the method generates a representative netlist comprising soft design models (308, 312, and 314) which in turn comprises one or more template cells. The representative netlist further includes instances of any specifically identified hard macros (310). The process of generating a representative netlist may include defining interfaces (405), creating timing models (406), and creating physical models (407) for each soft design model; and instantiating and connecting each soft design model in the top-level netlist. The process of creating soft design models for each template cell includes defining the area and routing capabilities of each template cell.

The representative netlist contains a mix of hard timing model with soft physical characteristics that allows users to efficiently conduct design explorations. In addition, the generation of a representative netlist may be performed automatically by the computer program without user intervention. In this example, the method generates the representative netlist using the initial area of the soft design models, the corresponding template cells, and external connections (module ports) of the soft design models. Note that the user is no longer required to specify shapes, pin-locations, or routing obstructions. Instead, the user works with architectural level design parameters that are in the representative netlist description of the integrated circuit.

At block 408, the method places and routes the integrated circuit design that allows the user to perform floorplan exploration. In one implementation, the functions of block 408 may be performed by blocks 409, 410, and 411. In block 409, the method performs a sizing operation on the design to determine the size of a semiconductor die that is required for the design. In block 410, the method places the input/output ports of the soft design models and places the corresponding template cells contained in each of the soft design models. In block 411, the method explores the routing of the integrated circuit to create a representative physical implementation using the soft design models and their corresponding template cells. Note that boundary pins are assigned to physical locations on one or more of the soft design models, from which the netlist is constructed. In this approach, each template cell occupies an area within a soft design model as if it is represented by its real gate-level netlist.

At block 412, the method analyzes the representative physical implementation. In one implementation, the functions of block 412 may be performed by blocks 413 and 414. In block 413, the method analyzes the timing of the representative physical implementation of the integrated circuit to ensure the design has met its timing goals. In block 414, the method analyzes the routing congestions of the representative physical implementation to ensure routing-related design goals are met.

At block 416, a determination is made as to whether the design goals are met. If the design goals are met (416_Yes), the method moves to block 418. In the alternative, if the design goals are not met (416_No), the method moves to block 408 and repeats the portion of the design explorations from block 408 to block 414 until the design goals are met. The method ends in block 418.

As shown in the flow chart of FIG. 4, the user is not required to repeat the process of creating the representative netlist (404) even though the pin locations or shapes of the soft design models representing the black-box design blocks may have been changed between different iterations of the design explorations. This method provides at least two advantages over the conventional black-box design approach. First, there is no need to modify the representative netlist due to the changes in pin locations or shapes of the soft design models. Second, the method eliminates problems associated with the black-box physical models. Both of these improvements allow the user to concentrate on the real problems of design explorations, and allow the user to conduct design explorations more effectively and efficiently.

Figure 5A:
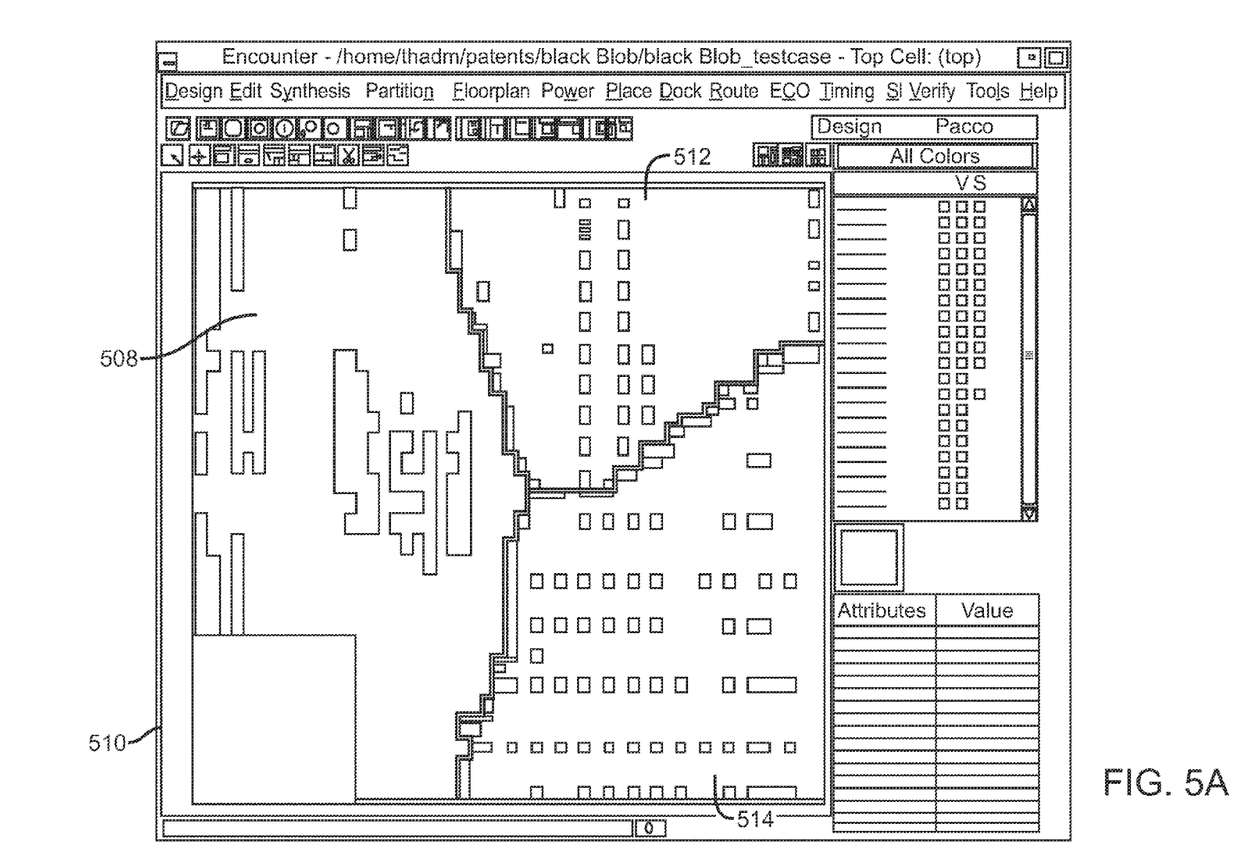
FIGS. 5A-5B illustrate user interfaces for using the method of conducting design explorations according to embodiments of the present invention.
Figure 5B:
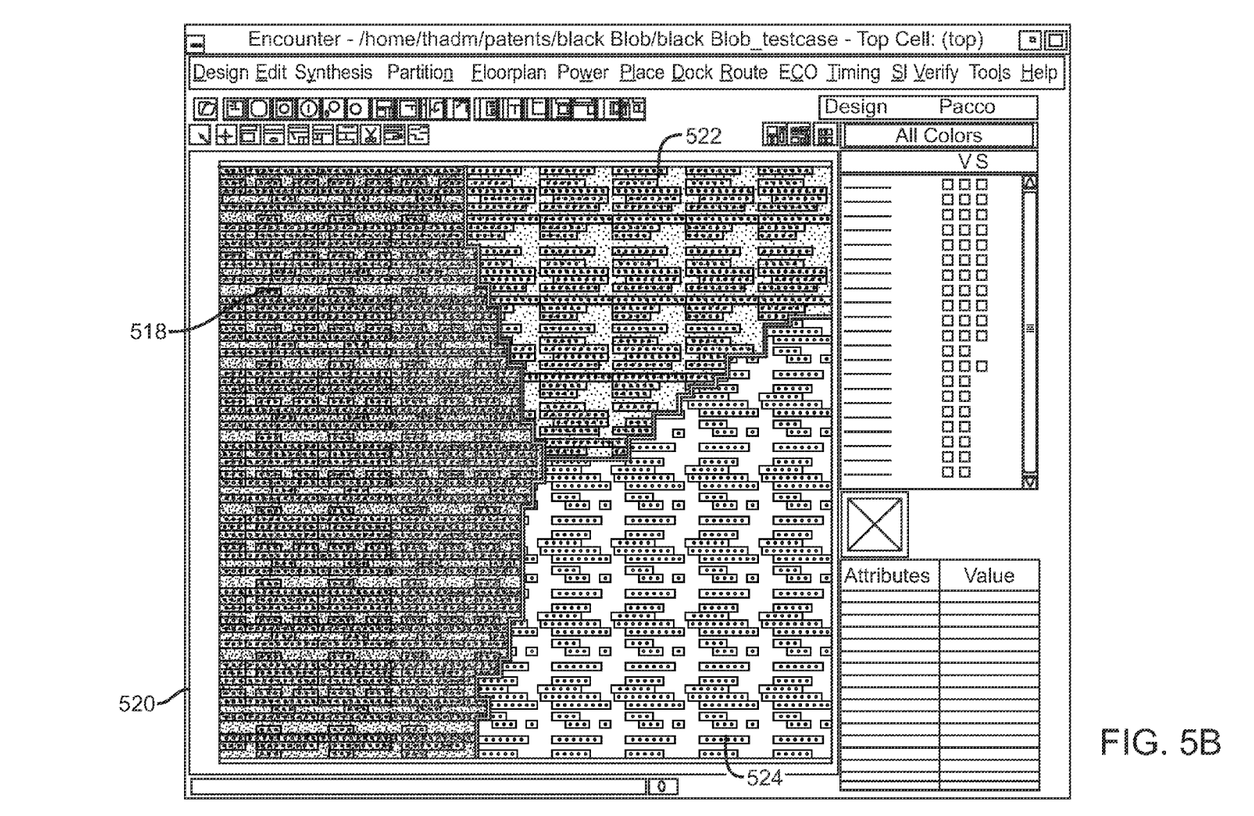

FIGS. 5A-5B illustrate user interfaces for using the method of conducting design explorations according to embodiments of the present invention. In FIG. 5A, the black-box design blocks 108, 112, and 114 of FIG. 1 are implemented by blocks 508, 512, and 514 respectively. The black-box design block 110 is represented by block 510 as a hard macro cell with its shape unchanged. The template cells are automatically placed and shaped as soft physical entities. FIG. 5B illustrates a screen shot of a standard-cell implementation of the exemplary design shown in FIG. 5A. Note that the standard-cell implementation as shown in FIG. 5B is very much like the representative design created using the soft design models in FIG. 5A.

As described above, the current solution addresses at least the following issues with the conventional approach of using black-box design blocks. First, the current solution addresses the issue of routing congestion through a channel between two black-box design blocks. This problem is due to the fact that in the conventional method nets cannot be routed over the black-box design blocks. As a result, many nets are routed through the channel between the black-boxes. This type of congestion may cause a floorplan to look infeasible when in fact it is not. This type of congestion may also cause the timing of a design to look much worse than it is. The current solution addresses this issue by allowing nets to route through the soft models and thus provides a closer model of the actual situation for routing the design.

Second, the current solution addresses the issue of routing congestion due to poor pin-placements at the black-box design blocks. It is common during floorplan exploration for black-box design blocks to be moved significantly from their original locations, and thus changes the relationships of the design blocks with respect to each other. In the conventional approach, each move may require many pins in the interfaces of black-box design blocks to be moved in order to achieve optimal routing results for that particular iteration of the design exploration. This can be a rather time-consuming task, and some of the effort may be wasted if subsequent iterations of the design exploration would require the black-box design blocks to be moved again. The current solution addresses this issue by eliminating the manual move of pin locations when a soft design model moves. The pin locations may be determined dynamically by the place and route program without user interaction.

Third, the current solution addresses the issue of insufficient routing resources. This problem often appears in the conventional approach since many routing resources are "100% consumed" by the total obstructions of the routing channels by the black-box design blocks. This problem may mislead the designers to believe that a particular floorplan is not feasible, and thus miss a more optimal design of the integrated circuit. The current solution addresses this issue by allowing nets to route through the soft models and thus allows the user to identify the more optimal design of the integrated circuit.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A computer implemented method for implementing an electronic design, the method comprising:
    using at least one processor that is configured or programmed for performing a process, the process comprising:
    identifying or generating a soft design model corresponding to a design block, wherein
        the soft design model is configured with a flexible shape and a flexible pin location,
        the design block comprises the soft design model, and
        the soft design model comprises an area specification for the soft design model, in which the area specification comprises an area of the soft design model;
    performing placement and routing for the electronic design, wherein the soft design model is included in a layout for the electronic design;
    configuring one or more shape parameters for the soft design model; and
    analyzing the layout as to whether design goals are met.

2. The computer implemented method of claim 1, in which the soft design model is constructed with collateral information from a black box design block, wherein the collateral information comprises timing information and physical parameters.

3. The computer implemented method of claim 2, in which the timing information comprises propagation delay or timing arc information.

4. The computer implemented method of claim 2, in which the physical parameters comprise one or more shape, layer, or pin parameters.

5. The computer implemented method of claim 1, the act of analyzing the layout comprises timing analysis.

6. The computer implemented method of claim 1, in which the one or more shape parameters are changed between different iterations of design exploration.

7. The computer implemented method of claim 1, in which a net is routed through the soft design model.

8. A system for implementing an electronic design, comprising:

at least one processor that is programmed or configured for performing a process, the process comprising:

identifying or generating a soft design model corresponding to a design block, wherein
- the soft design model is configured with a flexible shape and a flexible pin location,
- the design block comprises the soft design model, and
- the soft design model comprises an area specification for the soft design model, in which the area specification comprises an area of the soft design model;

performing placement and routing for the electronic design, wherein the soft design model is included in a layout for the electronic design;

configuring one or more shape parameters for the soft design model; and analyzing the layout as to whether design goals are met.

9. The system of claim 8, in which the soft design model is constructed with collateral information from a black box design block, wherein the collateral information comprises timing information and physical parameters.

10. The system of claim 9, in which the timing information comprises propagation delay or timing arc information.

11. The system of claim 9, in which the physical parameters comprise shape, layer, or pin parameters.

12. The system of claim 8, the act for analyzing the layout comprises timing analysis.

13. The system of claim 8, in which the one or more shape parameters are changed between different iterations of design exploration.

14. The system of claim 8, in which a net is routed through the soft design model.

15. A computer program product comprising a non-transitory computer-usable storage medium having executable code which, when executed by at least one processor, causes the at least one processor to execute a method for implementing an electronic design, the method comprising:

using the at least one processor that is configured or programmed for performing a process, the process comprising:

identifying or generating a soft design model corresponding to a design block, wherein
- the soft design model is configured with a flexible shape and a flexible pin location,
- the design block comprises the soft design model, and
- the soft design model comprises an area specification for the soft design model, in which the area specification comprises an area of the soft design model;

performing placement and routing for the electronic design, wherein the soft design model is included in a layout for the electronic design;

configuring one or more shape parameters for the soft design model; and analyzing the layout as to whether design goals are met.

16. The computer program product of claim 15, in which the soft design model is constructed with collateral information from a black box design block, wherein the collateral information comprises timing information and physical parameters.

17. The computer program product of claim 16, in which the timing information comprises propagation delay or timing arc information.

18. The method of claim 16, in which the physical parameters comprise shape, layer, or pin parameters.

19. The computer program product of claim 15, the act of analyzing the layout comprises timing analysis.

20. The computer program product of claim 15, in which the one or more shape parameters are changed between different iterations of design exploration.

21. The computer program product of claim 15, in which a net is routed through the soft design model.

* * * * *